United States Patent
Imada et al.

(10) Patent No.: US 8,623,585 B2
(45) Date of Patent: Jan. 7, 2014

(54) POSITIVE-TYPE PHOTORESIST COMPOSITION

(75) Inventors: Tomoyuki Imada, Ichihara (JP); Takakazu Kage, Ichihara (JP); Norifumi Imaizumi, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/884,788

(22) PCT Filed: Oct. 25, 2011

(86) PCT No.: PCT/JP2011/074492
§ 371 (c)(1), (2), (4) Date: May 10, 2013

(87) PCT Pub. No.: WO2012/063636
PCT Pub. Date: May 18, 2012

(65) Prior Publication Data
US 2013/0244174 A1    Sep. 19, 2013

(30) Foreign Application Priority Data
Nov. 10, 2010 (JP) .................. 2010-251761

(51) Int. Cl.
G03F 7/004 (2006.01)
G03F 7/032 (2006.01)
C08L 61/06 (2006.01)
C08G 8/28 (2006.01)

(52) U.S. Cl.
USPC ........ 430/270.1; 430/905; 525/480; 525/491; 525/501; 525/516

(58) Field of Classification Search
USPC ........ 430/270.1, 905; 525/480, 491, 501, 516
See application file for complete search history.

(56) References Cited

U.S. PATENT DOCUMENTS
2012/0171611 A1*  7/2012 Ideno et al. ............... 430/270.1

FOREIGN PATENT DOCUMENTS
| JP | 02-055359 A | 2/1990 |
| JP | 05-061195 A | 3/1993 |
| JP | 09-073169 A | 3/1997 |
| JP | 09-090626 A | 4/1997 |
| JP | 2006-113136 A | 4/2006 |
| JP | 2008-088197 A | 4/2008 |

OTHER PUBLICATIONS

International Search Report dated Dec. 6, 2011, issued for PCT/JP2011/074492.

* cited by examiner

Primary Examiner — Amanda C. Walke
(74) Attorney, Agent, or Firm — Edwards Wildman Palmer LLP

(57) ABSTRACT

Provided is a positive photoresist composition containing, as an essential component, a novolac phenolic resin (C) prepared by condensing an aromatic compound (A) represented by general formula (1) or (2) with an aliphatic aldehyde (B).

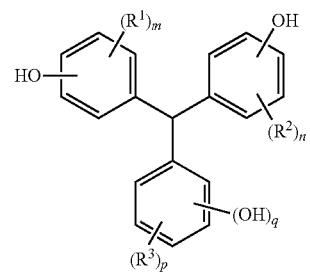

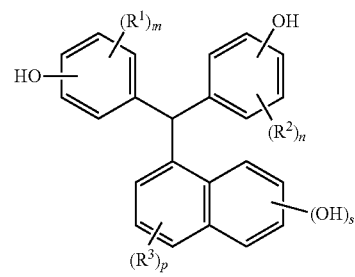

This positive photoresist composition has high sensitivity and high heat resistance at the same time, and is suitable for use as a positive photoresist in, for example, the manufacture of semiconductor devices such as ICs and LSIs, the manufacture of displays such as LCDs, and the manufacture of printing plates. (In the formulas, $R^1$, $R^2$, and $R^3$ are each independently an alkyl group having 1 to 8 carbon atoms; m, n, and p are each independently an integer of 0 to 4; q is an integer of 1 to (5−p); and s is an integer of 1 to (9−p).)

8 Claims, No Drawings

POSITIVE-TYPE PHOTORESIST COMPOSITION

TECHNICAL FIELD

The present invention relates to positive photoresist compositions with high developability and heat resistance.

BACKGROUND ART

Positive photoresists containing an alkali-soluble resin and a photosensitizer such as 1,2-naphthoquinone diazide are known as resists for use in, for example, the manufacture of semiconductor devices such as ICs and LSIs, the manufacture of displays such as LCDs, and the manufacture of printing plates. One proposed positive photoresist composition contains a mixture of an m-cresol novolac resin and a p-cresol novolac resin as an alkali-soluble resin (see, for example, PTL 1).

Whereas the positive photoresist composition disclosed in PTL 1 is developed to provide high developability, e.g., high sensitivity, there is a need for a higher sensitivity because finer patterns have been used with the increasing packing density of semiconductor devices in recent years. Unfortunately, the positive photoresist composition disclosed in PTL 1 has insufficient sensitivity for use in forming such finer patterns. A need also exists for a higher heat resistance because semiconductor manufacturing processes, for example, involve various heat treatments. Unfortunately, the positive photoresist composition disclosed in PTL 1 has insufficient heat resistance.

Also proposed is a photoresist phenolic resin with high sensitivity and high heat resistance that is prepared by reacting, for example, p-cresol with an aromatic aldehyde and then adding and reacting a phenol and formaldehyde in the presence of an acid catalyst (see, for example, PTL 2). This photoresist phenolic resin has a higher heat resistance than those in the related art, although it has insufficient heat resistance to meet the high level of heat resistance required in recent years.

Also proposed is a photoresist phenolic resin with high sensitivity and high heat resistance that is prepared by reacting a phenol such as m-cresol, p-cresol, or 2,3-xylenol with an aromatic aldehyde and then adding and reacting formaldehyde in the presence of an acid catalyst (see, for example, PTL 3). This photoresist phenolic resin has a higher sensitivity than those in the related art, although it has insufficient heat resistance to meet the high level of heat resistance required in recent years.

One problem is that a novolac resin, which is an alkali-soluble resin, designed to have a higher alkali solubility so that it has a higher sensitivity exhibits a lower heat resistance, whereas a novolac resin designed to have a higher heat resistance exhibits a lower sensitivity, and this makes it difficult to achieve high sensitivity and high heat resistance at the same time at a higher level. Accordingly, there is a need for a material that has high sensitivity and high heat resistance at the same time at a higher level.

CITATION LIST

Patent Literature
PTL 1: Japanese Unexamined Patent Application Publication No. 2-55359
PTL 2: Japanese Unexamined Patent Application Publication No. 2008-88197
PTL 3: Japanese Unexamined Patent Application Publication No. 9-90626

SUMMARY OF INVENTION

Technical Problem

A problem to be solved by the present invention is to provide a positive photoresist composition that has high sensitivity and high heat resistance at the same time, which have so far been difficult to achieve at the same time, at a higher level and thus has extremely high sensitivity and heat resistance.

Solution to Problem

After conducting extensive research, the inventors have found that a positive photoresist composition containing a novolac phenolic resin prepared by polycondensing an alkyl-substituted phenol with a phenolic-hydroxyl containing aromatic aldehyde and then condensing the resulting aromatic compound with an aliphatic aldehyde has high sensitivity and heat resistance, thus completing the present invention.

Specifically, the present invention relates to a positive photoresist composition containing, as an essential component, a novolac phenolic resin (C) prepared by condensing an aromatic compound (A) represented by general formula (1) or (2) with an aliphatic aldehyde (B).

[Chem. 1]

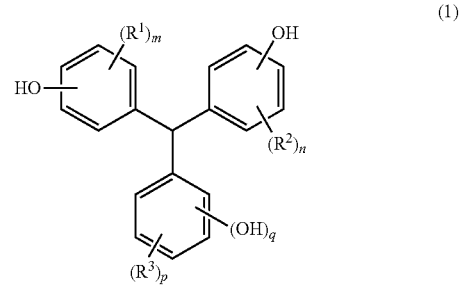

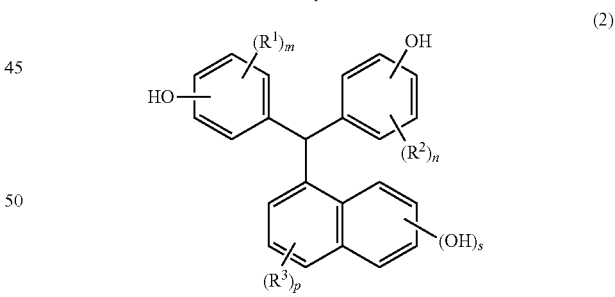

(wherein $R^1$, $R^2$, and $R^3$ are each independently an alkyl group having 1 to 8 carbon atoms; m, n, and p are each independently an integer of 0 to 4; q is an integer of 1 to (5−p); and s is an integer of 1 to (9−p)).

Advantageous Effects of Invention

The positive photoresist composition of the present invention has high sensitivity and high heat resistance at the same time, which have so far been difficult to achieve at the same time, at a higher level; therefore, it is suitable for use as a positive photoresist in, for example, the manufacture of semiconductor devices such as ICs and LSIs with finer patterns, the manufacture of displays such as LCDs, and the manufacture of printing plates.

DESCRIPTION OF EMBODIMENTS

A positive photoresist composition of the present invention contains, as an essential component, a novolac phenolic resin (C) prepared by condensing an aromatic compound (A) represented by general formula (1) or (2) with an aliphatic aldehyde (B).

[Chem. 2]

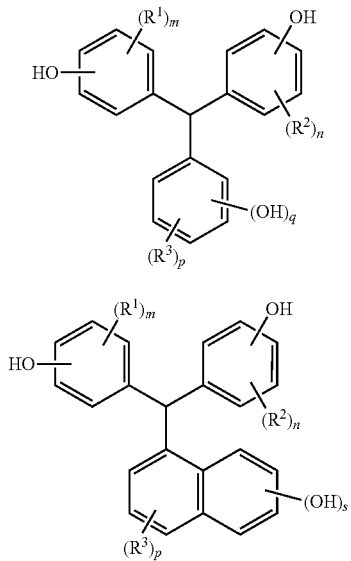

(where $R^1$, $R^2$, and $R^3$ are each independently an alkyl group having 1 to 8 carbon atoms; m, n, and p are each independently an integer of 0 to 4; q is an integer of 1 to (5−p); and s is an integer of 1 to (9−p)).

The aromatic compound (A) can be prepared by, for example, polycondensing an alkyl-substituted phenol (a1) with a phenolic-hydroxyl containing aromatic aldehyde (a2).

The alkyl-substituted phenol (a1) is a compound having the hydrogen atoms on the phenolic aromatic ring thereof partially or completely substituted by alkyl groups. Examples of alkyl groups include alkyl groups having 1 to 8 carbon atoms, preferably methyl. Examples of alkyl-substituted phenols (a1) include monoalkylphenols such as o-cresol, m-cresol, p-cresol, o-ethylphenol, m-ethylphenol, p-ethylphenol, p-octylphenol, p-t-butylphenol, o-cyclohexylphenol, m-cyclohexylphenol, and p-cyclohexylphenol; dialkylphenols such as 2,5-xylenol, 3,5-xylenol, 3,4-xylenol, 2,4-xylenol, and 2,6-xylenol; and trialkylphenols such as 2,3,5-trimethylphenol and 2,3,6-trimethylphenol. Among these alkyl-substituted phenols, phenols having two alkyl substituents on the aromatic ring thereof are preferred for their good balance of heat resistance and alkali solubility, and such examples include 2,5-xylenol and 2,6-xylenol. These alkyl-substituted phenols (a1) can be used alone or in combination.

The aromatic aldehyde (a2) is a compound having at least one hydroxyl group and an aldehyde group on the aromatic ring thereof. Examples of aromatic aldehydes (a2) include hydroxybenzaldehydes such as salicylaldehyde, m-hydroxybenzaldehyde, and p-hydroxybenzaldehyde; dihydroxybenzaldehydes such as 2,4-dihydroxybenzaldehyde and 3,4-dihydroxybenzaldehyde; vanillin compounds such as vanillin, ortho-vanillin, isovanillin, and ethylvanillin; and hydroxynaphthaldehydes such as 2-hydroxy-1-naphthaldehyde and 6-hydroxy-2-naphthaldehyde. Among these aromatic aldehydes (a2), p-hydroxybenzaldehyde, 2-hydroxy-1-naphthaldehyde, and 6-hydroxy-2-naphthaldehyde are preferred for their industrial availability and good balance of heat resistance and alkali solubility. These aromatic aldehydes (a2) can be used alone or in combination.

Examples of aliphatic aldehydes (B) include formaldehyde, paraformaldehyde, 1,3,5-trioxane, acetaldehyde, propionaldehyde, tetraoxymethylene, polyoxymethylene, chloral, hexamethylenetetramine, furfural, glyoxal, n-butyraldehyde, caproaldehyde, allylaldehyde, crotonaldehyde, and acrolein. These aldehyde compounds (B) can be used alone or in combination. Preferably, the aliphatic aldehyde (B) used is formaldehyde, which may be used in combination with other aliphatic aldehydes. If formaldehyde is used in combination with other aliphatic aldehydes, the amount of other aliphatic aldehydes used is preferably 0.05 to 1 mole per mole of formaldehyde.

An example of a method for manufacturing the novolac phenolic resin (C), which is an essential component of the positive photoresist composition of the present invention, includes the following three steps.

First Step

The alkyl-substituted phenol (a1) is polycondensed with the aromatic aldehyde (a2) by heating at 60° C. to 140° C. in the presence of an acid catalyst, optionally using a solvent, to prepare the aromatic compound (A).

Second Step

The aromatic compound (A) prepared in the first step is isolated from the reaction solution.

Third Step

The aromatic compound (A) isolated in the second step is polycondensed with the aliphatic aldehyde (B) by heating at 60° C. to 140° C. in the presence of an acid catalyst, optionally using a solvent, to prepare the novolac phenolic resin (C), which is an essential component of the positive photoresist composition of the present invention.

Examples of acid catalysts used in the first and third steps include acetic acid, oxalic acid, sulfuric acid, hydrochloric acid, phenolsulfonic acid, paratoluenesulfonic acid, zinc acetate, and manganese acetate. These acid catalysts can be used alone or in combination. Among these acid catalysts, sulfuric acid and paratoluenesulfonic acid are preferred for the first step, and sulfuric acid, oxalic acid, and zinc acetate are preferred for the third step, because of their high activities. The acid catalyst may be added before or during the reaction.

Examples of solvents optionally used in the first and third steps include monoalcohols such as methanol, ethanol, and propanol; polyols such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, and glycerol; glycol ethers such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol monophenyl ether; cyclic ethers such as 1,3-dioxane and 1,4-dioxane; glycol esters such as ethylene glycol acetate; ketones such as acetone, methyl ethyl ketone, and methyl isobutyl ketone; and aromatic hydrocarbons such as toluene and xylene. These solvents can be used alone or in combination. Among these solvents, 2-ethoxyethanol is preferred for its high ability to dissolve the compound to be prepared.

The charge ratio [(a1)/(a2)] of the alkyl-substituted phenol (a1) to the aromatic aldehyde (a2) in the first step is preferably 1/0.2 to 1/0.5, more preferably 1/0.25 to 1/0.45, in molar ratio, which is advantageous in terms of the removability of the unreacted alkyl-substituted phenol (a1), the yield of the product, and the purity of the reaction product.

The charge ratio [(A)/(B)] of the aromatic compound (A) to the aliphatic aldehyde (B) in the third step is preferably 1/0.5 to 1/1.2, more preferably 1/0.6 to 1/0.9, in molar ratio, which avoids excessive polymerization (gelation) and thus provides a photoresist phenolic resin with a suitable molecular weight.

An example of a method for isolating the aromatic compound (A) from the reaction solution in the second step includes pouring the reaction solution into a poor solvent (S1) in which the reaction product is insoluble or poorly soluble, filtering off the resulting precipitate, dissolving the precipitate in a solvent (S2) in which the reaction product is soluble and which is miscible with the poor solvent (S1), pouring the solution into the poor solvent (S1) again, and filtering off the resulting precipitate. Examples of poor solvents (S1) used therefor include water; monoalcohols such as methanol, ethanol, and propanol; aliphatic hydrocarbons such as n-hexane, n-heptane, n-octane, and cyclohexane; and aromatic hydrocarbons such as toluene and xylene. Among these poor solvents (S1), water and methanol are preferred because the acid catalyst can be efficiently removed together. Examples of solvents (S2) include monoalcohols such as methanol, ethanol, and propanol; polyols such as ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, and glycerol; glycol ethers such as 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol monophenyl ether; cyclic ethers such as 1,3-dioxane and 1,4-dioxane; glycol esters such as ethylene glycol acetate; and ketones such as acetone, methyl ethyl ketone, and methyl isobutyl ketone. If the poor solvent (S1) used is water, (S2) is preferably acetone. The above poor solvents (S1) and solvents (S2) can be used alone or in combination.

If an aromatic hydrocarbon such as toluene or xylene is used as a solvent in the first and third steps, the aromatic compound (A) formed by the reaction dissolves in the solvent when heated at 80° C. or higher and can therefore be isolated simply by cooling the solution to precipitate the aromatic compound (A) as crystals and then filtering off the precipitate. This eliminates the need to use the poor solvent (S1) and the solvent (S2).

The above isolation method in the second step yields the aromatic compound (A) represented by general formula (1) or (2).

[Chem. 3]

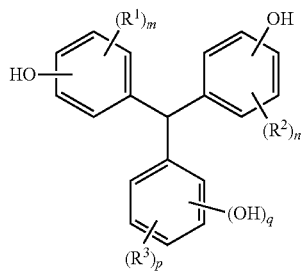
(1)

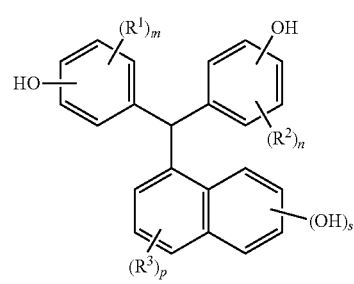
(2)

(where $R^1$, $R^2$, and $R^3$ are each independently an alkyl group having 1 to 8 carbon atoms; m, n, and p are each independently an integer of 0 to 4; q is an integer of 1 to (5−p); and s is an integer of 1 to (9−p)).

The novolac phenolic resin (C) prepared by the method of manufacture described above preferably has a weight average molecular weight (Mw) of 2,000 to 35,000, more preferably 2,000 to 25,000. The weight average molecular weight (Mw) is measured by gel permeation chromatography (hereinafter abbreviated as "GPC") under the following measurement conditions.

GPC Measurement Conditions

Measurement equipment: "HLC-8220 GPC" from Tosoh Corporation

Columns: "Shodex KF802" (8.0 mm ID×300 mm) from Showa Denko K.K.

+"Shodex KF802" (8.0 mm ID×300 mm) from Showa Denko K.K.

+"Shodex KF803" (8.0 mm ID×300 mm) from Showa Denko K.K.

+"Shodex KF804" (8.0 mm ID×300 mm) from Showa Denko K.K.

Column temperature: 40° C.

Detector: differential refractive index detector (RI)

Data processing: "GPC-8020 Model II version 4.30" from Tosoh Corporation

Developing solvent: tetrahydrofuran

Flow rate: 1.0 mL/min

Sample: microfiltered tetrahydrofuran solution with resin solid content of 0.5% by mass (100 μl)

Standards: monodisperse polystyrenes below

Standards: Monodisperse Polystyrenes

"A-500" from Tosoh Corporation

"A-2500" from Tosoh Corporation

"A-5000" from Tosoh Corporation

"F-1" from Tosoh Corporation

"F-2" from Tosoh Corporation

"F-4" from Tosoh Corporation

"F-10" from Tosoh Corporation

"F-20" from Tosoh Corporation

The novolac phenolic resin (C) prepared by the method of manufacture described above, which is an essential component as an alkali-soluble resin for the positive photoresist composition of the present invention, may be used in combination with another alkali-soluble resin (D).

The alkali-soluble resin (D) may be any resin soluble in an alkaline aqueous solution, preferably a cresol novolac resin. The cresol novolac resin is a novolac phenolic resin prepared by condensing a phenolic compound and an aldehyde compound as raw materials and is manufactured using at least one phenolic compound selected from the group consisting of o-cresol, m-cresol, and p-cresol as an essential raw material.

Whereas o-cresol, m-cresol, or p-cresol is essential as the phenolic compound used as a raw material for the cresol novolac resin, it may be used in combination with other phenols and derivatives thereof. Examples of such phenols and derivatives thereof include phenol; xylenols such as 2,3-xylenol, 2,4-xylenol, 2,5-xylenol, 2,6-xylenol, 3,4-xylenol, and 3,5-xylenol; ethylphenols such as o-ethylphenol, m-ethylphenol, and p-ethylphenol; butylphenols such as isopropylphenol, butylphenol, and p-t-butylphenol; alkylphenols such as p-pentylphenol, p-octylphenol, p-nonylphenol, and p-cumylphenol; halogenated phenols such as fluorophenol, chlorophenol, bromophenol, and iodophenol; monosubstituted phenols such as p-phenylphenol, aminophenol, nitrophenol, dinitrophenol, and trinitrophenol; fused polycyclic phenols such as 1-naphthol and 2-naphthol; and polyhydric phenols such as resorcin, alkylresorcins, pyrogallol, catechol, alkylcatechols, hydroquinone, alkylhydroquinones, phloroglucin, bisphenol A, bisphenol F, bisphenol S, and dihydroxynaphthalene. These other phenols and derivatives thereof can be used alone or in combination. If the phenolic compound is used in combination with other phenols and derivatives thereof, the amount of other phenols and derivatives thereof used is preferably 0.05 to 1 mole per mole of the total amount of o-cresol, m-cresol, and p-cresol.

Examples of aldehyde compounds used as a raw material for the cresol novolac resin include formaldehyde, paraformaldehyde, trioxane, acetaldehyde, propionaldehyde, polyoxymethylene, chloral, hexamethylenetetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde, and salicylaldehyde. These aldehyde compounds can be used alone or in combination. Preferably, formaldehyde is used as a raw material for the cresol novolac resin, and formaldehyde may be used in combination with other aldehyde compounds. If formaldehyde is used in combination with other aldehyde compounds, the amount of other aldehyde compounds used is preferably 0.05 to 1 mole per mole of formaldehyde.

Among the cresol novolac resins prepared using the phenolic compounds and aldehyde compounds illustrated above as raw materials, a cresol novolac resin is preferred that is prepared by condensing m-cresol as a phenolic compound, alone or in combination with p-cresol, with formaldehyde as an aldehyde compound. The molar ratio [m-cresol/p-cresol] of m-cresol to p-cresol is preferably 10/0 to 2/8, more preferably 7/3 to 2/8, which allows high sensitivity and high heat resistance at the same time.

The condensation reaction of the phenolic compound with the aldehyde compound is preferably performed in the presence of an acid catalyst. Examples of acid catalysts include oxalic acid, sulfuric acid, hydrochloric acid, phenolsulfonic acid, paratoluenesulfonic acid, zinc acetate, and manganese acetate. These acid catalysts can be used alone or in combination. Among these acid catalysts, oxalic acid is preferred for its high catalytic activity. The acid catalyst may be added before or during the reaction.

The molar ratio [(F)/(P)] of the aldehyde compound (F) to the phenolic compound (P) in the manufacture of the cresol novolac resin is preferably 0.3 to 1.6, more preferably 0.5 to 1.3, which allows high sensitivity and heat resistance.

A specific example of a method for manufacturing the cresol novolac resin includes heating the phenolic compound, the aldehyde compound, and the acid catalyst to 60° C. to 140° C. to facilitate a polycondensation reaction and then removing water and the monomers under reduced pressure.

In addition to the novolac phenolic resin (C) and the optional alkali-soluble resin (D), the positive photoresist composition of the present invention usually contains a photosensitizer (E) and a solvent (F).

The photosensitizer (E) can be a quinone-diazide containing compound. Examples of quinone-diazide containing compounds include complete esters, partial esters, amides, and partial amides of polyhydroxybenzophenone compounds such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone, and 2,3,3',4,4',5'-hexahydroxybenzophenone; bis[(poly)hydroxyphenyl]alkane compounds such as bis(2,4-dihydroxyphenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-(2-(4-hydroxyphenyl)-2-propyl)phenyl]ethylidene}bisphenol, and 3,3'-dimethyl-{1-[4-(2-(3-methyl-4-hydroxyphenyl)-2-propyl)phenyl]ethylidene}bisphenol; tris(hydroxyphenyl)methanes and methyl-substituted derivatives thereof such as tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane, and bis(4-hydroxy-3,5-dimethylphenyl)-3,4-dihydroxyphenylmethane; and bis(cyclohexylhydroxyphenyl)(hydroxyphenyl)methanes and methyl-substituted derivatives thereof such as bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(3-cyclohexyl-2-hydroxyphenyl)-3-hydroxyphenylmethane, bis(5-cyclohexyl-4-hydroxy-3-methylphenyl)-4-hydroxyphenylmethane, bis(5-cyclohexyl-4-hydroxy-3-methylphenyl)-3-hydroxyphenylmethane, bis(5-cyclohexyl-4-hydroxy-3-methylphenyl)-2-hydroxyphenylmethane, bis(3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenylmethane, and bis(5-cyclohexyl-2-hydroxy-4-methylphenyl)-4-hydroxyphenylmethane, with quinone-diazide containing sulfonic acids such as naphthoquinone-1,2-diazide-5-sulfonic acid, naphthoquinone-1,2-diazide-4-sulfonic acid, and ortho-anthraquinone diazide sulfonic acid. These photosensitizers (E) can be used alone or in combination.

The content of the photosensitizer (E) in the positive photoresist composition of the present invention is preferably 3 to 50 parts by mass, more preferably 5 to 30 parts by mass, per 100 parts by mass of the total amount of novolac phenolic resin (C) and alkali-soluble resin (D), which provides good sensitivity and allows formation of a desired pattern.

Examples of solvents (F) include ethylene glycol alkyl ethers such as ethylene glycol monomethyl ether, ethylene glycol monoethyl ether, ethylene glycol monopropyl ether, and ethylene glycol monobutyl ether; diethylene glycol dialkyl ethers such as diethylene glycol dimethyl ether, diethylene glycol diethyl ether, diethylene glycol dipropyl ether, and diethylene glycol dibutyl ether; ethylene glycol alkyl ether acetates such as methyl cellosolve acetate and ethyl cellosolve acetate; propylene glycol alkyl ether acetates such as propylene glycol monomethyl ether acetate, propylene glycol monoethyl ether acetate, and propylene glycol monopropyl ether acetate; ketones such as acetone, methyl ethyl ketone, cyclohexanone, and methyl amyl ketone; cyclic ethers such as dioxane; and esters such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate, and ethyl acetoacetate. These solvents (F) can be used alone or in combination.

The positive photoresist composition of the present invention preferably contains the solvent (F) in such an amount that the solid content concentration of the composition is 15% to 65% by mass, which provides sufficient flowability to form a uniform coating by a coating process such as spin coating.

In addition to the novolac phenolic resin (C), the other optional alkali-soluble resin (D), the photosensitizer (E), and the solvent (F), the positive photoresist composition of the present invention may contain various additives in such amounts as not to impair the advantages of the present invention. Examples of such additives include fillers, pigments, surfactants such as leveling agents, adhesion improvers, and dissolution accelerators.

The positive photoresist composition of the present invention can be prepared by mixing and stirring the novolac phenolic resin (C), the other optional alkali-soluble resin (D), the photosensitizer (E), the solvent (F), and optional various additives to homogeneity as usual.

If solid additives such as fillers and pigments are added to the positive photoresist composition of the present invention, they are preferably mixed and dispersed using a dispersing apparatus such as a dissolver, a homogenizer, or a three-roll mill. The composition can also be filtered through, for example, a mesh filter or a membrane filter to remove coarse particles and impurities.

After the positive photoresist composition of the present invention is exposed through a mask, the exposed portion exhibits increased solubility to alkali developers as a result of a structural change in the resin composition. Because the unexposed portion maintains low solubility to alkali developers, the solubility difference therebetween enables patterning by alkali development and thus allows the use of the positive photoresist composition as a resist material.

Examples of light sources for exposing the positive photoresist composition of the present invention include infrared light, visible light, ultraviolet light, far-ultraviolet light, X-rays, and electron beams. Among these light sources, ultraviolet light is preferred, and the g-line (wavelength: 436 nm) and the i-line (wavelength: 365 nm) of a high-pressure mercury lamp and an EUV laser (wavelength: 13.5 nm) are suitable.

Examples of alkali developers used for development after exposure include alkaline aqueous solutions of inorganic alkaline materials such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; and cyclic amines such as pyrrole and piperidine. These alkali developers may optionally contain, for example, alcohols and surfactants. The alkali concentration of the alkali developer is usually preferably 2% to 5% by mass, and a 2.38% by mass tetramethylammonium hydroxide aqueous solution is typically used.

EXAMPLES

The present invention is further illustrated by the following specific examples. The weight average molecular weights (Mw) of the resulting resins were measured under the following GPC measurement conditions.

GPC Measurement Conditions
  Measurement equipment: "HLC-8220 GPC" from Tosoh Corporation
  Columns: "Shodex KF802" (8.0 mm ID×300 mm) from Showa Denko K.K.
  +"Shodex KF802" (8.0 mm ID×300 mm) from Showa Denko K.K.
  +"Shodex KF803" (8.0 mm ID×300 mm) from Showa Denko K.K.
  +"Shodex KF804" (8.0 mm ID×300 mm) from Showa Denko K.K.
  Column temperature: 40° C.
  Detector: differential refractive index detector (RI)
  Data processing: "GPC-8020 Model II version 4.30" from Tosoh Corporation
  Developing solvent: tetrahydrofuran
  Flow rate: 1.0 mL/min
  Sample: microfiltered tetrahydrofuran solution with resin solid content of 0.5% by mass
  Injection volume: 0.1 mL
  Standards: monodisperse polystyrenes below
Standards: Monodisperse Polystyrenes
  "A-500" from Tosoh Corporation
  "A-2500" from Tosoh Corporation
  "A-5000" from Tosoh Corporation
  "F-1" from Tosoh Corporation
  "F-2" from Tosoh Corporation
  "F-4" from Tosoh Corporation
  "F-10" from Tosoh Corporation
  "F-20" from Tosoh Corporation Synthesis Example 1

Synthesis of Polycondensate (A-1)

A 100 mL two-necked flask equipped with a condenser and a thermometer was charged with 3.66 g (30 mmol) of 2,5-xylenol and 1.22 g (10 mmol) of p-hydroxybenzaldehyde, and the mixture was dissolved in 10 mL of 2-ethoxyethanol. After 1 mL of sulfuric acid was added with cooling in an ice bath, the solution was reacted by heating at 100° C. with stirring for 2 hours. After the reaction, the resulting solution was reprecipitated with water to obtain a crude product. The crude product was redissolved in acetone and was reprecipitated with water, and the resulting product was filtered and dried in vacuo to obtain 2.82 g of a polycondensate (C1) represented by formula (3) as pale yellow crystals.

[Chem. 4]

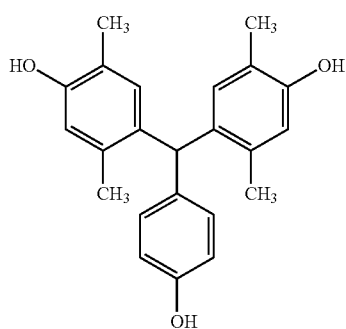

(3)

Synthesis Example 2

Synthesis of Polycondensate (A-2)

The procedure of Synthesis Example 1 was repeated except that the 2,5-xylenol used in Synthesis Example 1 was replaced by 2,6-xylenol to obtain 2.85 g of a polycondensate (C-2) represented by formula (4) as orange crystals.

[Chem. 5]

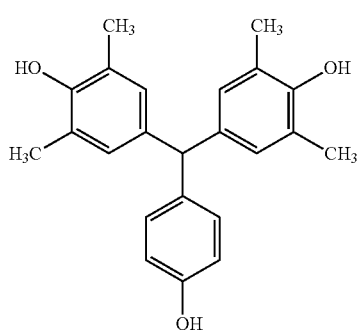

(4)

Synthesis Example 3

Synthesis of Phenolic Novolac Resin (C-1)

A 100 mL two-necked flask equipped with a condenser and a thermometer was charged with 1.74 g of the polycondensate (A-1) obtained in Synthesis Example 1 and 0.16 g of 92% by mass paraformaldehyde, and the mixture was dissolved in 5 ml of 2-ethoxyethanol and 5 ml of acetic acid. After 0.5 ml of sulfuric acid was added with cooling in an ice bath, the solution was reacted by heating at 70° C. with stirring for 4 hours. After the reaction, the resulting solution was reprecipitated with water to obtain a crude product. The crude product was redissolved in acetone and was reprecipitated with water, and the resulting product was filtered and dried in vacuo to obtain a phenolic novolac resin (C-1) as a pale yellow powder. A GPC measurement showed that the phenolic novolac resin (C-1) had a number average molecular weight (Mn) of 6,601, a weight average molecular weight (Mw) of 14,940, and a polydispersity (Mw/Mn) of 2.263.

Synthesis Example 4

Synthesis of Phenolic Novolac Resin (C-2)

The procedure of Synthesis Example 3 was repeated except that the polycondensate (A-1) used in Synthesis Example 3 was replaced by the polycondensate (A-2) obtained in Synthesis Example 2 to obtain 1.68 g of a phenolic novolac resin (C-2) as a pale yellow powder. A GPC measurement showed that the phenolic novolac resin (C-2) had a number average molecular weight (Mn) of 1,917, a weight average molecular weight (Mw) of 2,763, and a polydispersity (Mw/Mn) of 1.441.

Synthesis Example 5

Synthesis of Phenolic Novolac Resin (H1)

A four-necked flask equipped with a stirrer and a thermometer was charged with 648 g of m-cresol, 432 g of p-cresol, 2.5 g of oxalic acid, and 492 g of 42% by mass formaldehyde aqueous solution, and the mixture was reacted by heating. The resulting product was distilled to 200° C. under normal pressure to remove water and was distilled at 230° C. under reduced pressure for 6 hours to obtain 736 g of a phenolic novolac resin (H1). A GPC measurement showed that the phenolic novolac resin (H1) had a number average molecular weight (Mn) of 2,425, a weight average molecular weight (Mw) of 6,978, and a polydispersity (Mw/Mn) of 2.878.

Synthesis Example 6

Synthesis of Phenolic Novolac Resin (H2)

A four-necked flask equipped with a stirrer and a thermometer was charged with 497 g of p-cresol, 138 g of 3,4-dihydroxybenzaldehyde, and 5 g of paratoluenesulfonic acid, and the mixture was reacted by heating. After the mixture was reacted by heating at 100° C. with stirring for 4 hours, 2.7 g of triethylamine was added for neutralization. Also added were 334 g of m-cresol, 323 g of 37% by mass formaldehyde aqueous solution, and 4 g of oxalic acid, and the mixture was reacted under reflux for 2 hours. The resulting product was then heated to 200° C. under normal pressure to remove water and was heated to 230° C. under reduced pressure to remove water and the monomers, which yielded 598 g of a phenolic novolac resin (H2). A GPC measurement showed that the phenolic novolac resin (H2) had a number average molecular weight (Mn) of 4,365, a weight average molecular weight (Mw) of 11,634, and a polydispersity (Mw/Mn) of 2.665.

Synthesis Example 7

Synthesis of Phenolic Novolac Resin (H3)

A four-necked flask equipped with a stirrer and a thermometer was charged with 64.8 g of m-cresol, 21.6 g of p-cresol, 24.4 g of 2,3-xylenol, and 15.2 g of vanillin, and after the mixture was dissolved by heating to 90° C., 3.78 g of oxalic acid dihydrate was added. After 30 minutes, the mixture was heated to 130° C. and was refluxed for 8.5 hours. To the mixture, 60.7 g of 42% by mass formaldehyde aqueous solution was added dropwise over 30 minutes, and the mixture was further refluxed for 4 hours. After 30 g of ethyl 3-ethoxypropionate was added, the mixture was distilled to 200° C. under normal pressure to remove water and was distilled at 230° C. under reduced pressure for 6 hours to obtain 98 g of a phenolic novolac resin. In 300 g of acetone was dissolved 30 g of the phenolic novolac resin, and the solution was reprecipitated with 450 g of n-hexane with stirring. The remaining lower layer was dried under reduced pressure to obtain 21 g of a novolac resin (H3). A GPC measurement showed that the novolac resin (H3) had a number average molecular weight (Mn) of 3,280, a weight average molecular weight (Mw) of 8,932, and a polydispersity (Mw/Mn) of 2.723.

Preparation of Positive Photoresist Composition

The phenolic novolac resins obtained in Synthesis Examples 3 to 7 were used to prepare positive photoresist compositions as follows.

Example 1

To 75 parts by mass of propylene glycol monomethyl ether acetate (hereinafter abbreviated as "PGMEA") was added 14 parts by mass of the phenolic novolac resin (C-1) obtained in Synthesis Example 3, and it was mixed and dissolved to obtain a solution. To this solution was added 5 parts by mass of a photosensitizer ("P-200" from Toyo Gosei Co., Ltd., which is a condensate of 1 mol of 4,4'-[1-[4-[1-(4-hydroxyphenyl)-1methylethyl]phenyl]ethylidene]bisphenol with 2 mol of 1,2-naphthoquinone-2-diazide-5-sulfonylchloride), and it was mixed and dissolved to obtain a positive photoresist composition (1). This procedure was repeated without adding a photosensitizer to obtain a PGMEA solution of the phenolic novolac resin (C-1) as a positive photoresist composition (1').

Alkali Dissolution Rate Measurement and Sensitivity Evaluation

The positive photoresist composition (1), which contained a photosensitizer, and the positive photoresist composition (1'), which contained no photosensitizer, obtained in Example 1 above were each applied to a silicon wafer with a diameter of 5 inches using a spin coater and was dried at 110° C. for 60 seconds to form a thin film with a thickness of 1 μm. The thin film was dipped in an alkaline solution (2.38% by mass tetramethylammonium hydroxide aqueous solution) for 60 seconds, and the thickness thereof after dipping was measured using a thickness meter ("F-20" from Filmetrics, Inc.) to determine the alkali dissolution rate (ADR). The sensitivity and the alkaline solution resistance were evaluated from the resulting value according to the following scales. The evaluation of a positive photoresist composition containing no photosensitizer corresponds to the evaluation of an exposed portion of a positive photoresist coating, and the evaluation of a positive photoresist composition containing a photosensitizer corresponds to the evaluation of an unexposed portion of a positive photoresist coating.

Evaluation Scale of Sensitivity of Positive Photoresist Composition Containing No Photosensitizer A: The alkali dissolution rate was 20 nm/sec or higher.
B: The alkali dissolution rate was 10 nm/sec to lower than 20 nm/sec.
C: The alkali dissolution rate was lower than 10 nm/sec.

Evaluation Scale of Alkaline Solution Resistance of Positive Photoresist Composition Containing Photosensitizer A: The alkali dissolution rate was lower than 0.5 nm/sec.
B: The alkali dissolution rate was 0.5 nm/sec to lower than 1.0 nm/sec.
C: The alkali dissolution rate was 1.0 nm/sec or higher.

Glass Transition Temperature Measurement and Heat Resistance Evaluation

The positive photoresist composition (1) obtained in Example 1 above, which contained a photosensitizer, was applied to a silicon wafer with a diameter of 5 inches using a spin coater and was dried at 110° C. for 60 seconds to form a thin film with a thickness of 1 μm. The thin film was scraped off, and the glass transition temperature (hereinafter abbreviated as "Tg") thereof was measured. The Tg was measured using a differential scanning calorimeter ("differential scanning calorimeter (DSC) Q100" from TA Instruments) in a nitrogen atmosphere over a temperature range of −100° C. to 200° C. at a heating rate of 10° C./min. The heat resistance was evaluated from the resulting value of Tg according to the following scale:

A: The Tg was 150° C. or higher.
B: The Tg was lower than 150° C.

Example 2

The procedure of Example 1 was repeated except that the phenolic novolac resin (C-1) used in Example 1 was replaced by the phenolic novolac resin (C-2) obtained in Synthesis Example 4 to prepare a positive photoresist composition (2) containing a photosensitizer and a positive photoresist composition (2') containing no photosensitizer, and an alkali dissolution rate measurement and sensitivity evaluation and a glass transition temperature measurement and heat resistance evaluation were performed.

Comparative Example 1

The procedure of Example 1 was repeated except that the phenolic novolac resin (C-1) used in Example 1 was replaced by the phenolic novolac resin (H1) obtained in Synthesis Example 5 to prepare a positive photoresist composition (3) containing a photosensitizer and a positive photoresist composition (3') containing no photosensitizer, and an alkali dissolution rate measurement and sensitivity evaluation and a glass transition temperature measurement and heat resistance evaluation were performed.

Comparative Example 2

The procedure of Example 1 was repeated except that the phenolic novolac resin (C-1) used in Example 1 was replaced by the phenolic novolac resin (H2) obtained in Synthesis Example 6 to prepare a positive photoresist composition (4) containing a photosensitizer and a positive photoresist composition (4') containing no photosensitizer, and an alkali dissolution rate measurement and sensitivity evaluation and a glass transition temperature measurement and heat resistance evaluation were performed.

Comparative Example 3

The procedure of Example 1 was repeated except that the phenolic novolac resin (C-1) used in Example 1 was replaced by the phenolic novolac resin (H3) obtained in Synthesis Example 7 to prepare a positive photoresist composition (5) containing a photosensitizer and a positive photoresist composition (5') containing no photosensitizer, and an alkali dissolution rate measurement and sensitivity evaluation and a glass transition temperature measurement and heat resistance evaluation were performed.

Table 1 shows the measurements and evaluations of the positive photoresist compositions (1) to (5) and (1') to (5') obtained in Examples 1 and 2 and Comparative Examples 1 to 3.

p-cresol with 3,4-dihydroxybenzaldehyde and further condensing it with p-cresol and formaldehyde. The evaluations showed that the positive photoresist composition (4') prepared in Comparative Example 2, which contained no photosensitizer and corresponds to an exposed portion, had a low alkali dissolution rate, i.e., 12 nm/sec, indicating that it has insufficient sensitivity. The evaluations also showed that the

TABLE 1

|  |  | Example 1 | Example 2 | Comparative Example 1 | Comparative Example 2 | Comparative Example 3 |
|---|---|---|---|---|---|---|
| Positive photoresist composition (with photosensitizer/without photosensitizer) | | (1)/(1') | (2)/(2') | (3)/(3') | (4)/(4') | (5)/(5') |
| Novolac phenolic resin (alkali-soluble resin) | | (C-1) | (C-2) | (H1) | (H2) | (H3) |
| Evaluations | Alkali dissolution rate (ADR) without photosensitizer (nm/sec) | 150 | 150 | 9.6 | 12 | 80 |
| | Sensitivity | A | A | C | B | A |
| | Alkali dissolution rate (ADR) with photosensitizer (nm/sec) | 0.3 | 0.1 | 0.3 | 0.1 | 1.2 |
| | Alkaline solution resistance | A | A | A | A | B |
| | Tg (° C.) | 203 | 157 | 113 | 118 | 136 |
| | Heat resistance | A | A | B | B | B |

The evaluations in Table 1 showed that the positive photoresist composition (1') of the present invention obtained in Example 1, which contained no photosensitizer and corresponds to an exposed portion, had an extremely high alkali dissolution rate, i.e., 150 nm/sec, indicating that it has high sensitivity. The evaluations also showed that the positive photoresist composition (1) of the present invention obtained in Example 1, which contained a photosensitizer and corresponds to an unexposed portion, had an extremely low alkali dissolution rate, i.e., 0.3 nm/sec, indicating that a pattern remains successfully after alkali development. The evaluations also showed that the film of the positive photoresist composition (1) had an extremely high Tg, i.e., 203° C., indicating that it also has high heat resistance.

The evaluations also showed that the positive photoresist composition (2') of the present invention obtained in Example 2, which contained no photosensitizer and corresponds to an exposed portion, had an extremely high alkali dissolution rate, i.e., 150 nm/sec, indicating that it has high sensitivity. The evaluations also showed that the positive photoresist composition (2) of the present invention obtained in Example 2, which contained a photosensitizer and corresponds to an unexposed portion, had an extremely low alkali dissolution rate, i.e., 0.1 nm/sec, indicating that a pattern remains successfully after alkali development. The evaluations also showed that the film of the positive photoresist composition (2) had an extremely high Tg, i.e., 157° C., indicating that it also has high heat resistance.

In contrast, Comparative Example 1 is an example of a positive photoresist composition containing, as an alkali-soluble resin, a known phenolic novolac resin prepared by condensing m-cresol and p-cresol with formaldehyde. The evaluations showed that the positive photoresist composition (3') prepared in Comparative Example 1, which contained no photosensitizer and corresponds to an exposed portion, had a low alkali dissolution rate, i.e., 9.6 nm/sec, indicating that it has insufficient sensitivity. The evaluations also showed that the film of the positive photoresist composition (3) had a low Tg, i.e., 113° C., indicating that it also has insufficient heat resistance.

Comparative Example 2 is an example of a positive photoresist composition containing, as an alkali-soluble resin, a known phenolic novolac resin prepared by condensing film of the positive photoresist composition (4) had a low Tg, i.e., 118° C., indicating that it also has insufficient heat resistance.

Comparative Example 3 is an example of a positive photoresist composition containing, as an alkali-soluble resin, a known phenolic novolac resin prepared by condensing p-cresol with 3,4-dihydroxybenzaldehyde and further condensing it with p-cresol and formaldehyde. The evaluations showed that the positive photoresist composition (5') prepared in Comparative Example 2, which contained no photosensitizer and corresponds to an exposed portion, had a relatively high alkali dissolution rate, i.e., 80 nm/sec, indicating that it has good sensitivity, although the positive photoresist composition (2), which contained a photosensitizer and corresponds to an unexposed portion, had an insufficient alkali dissolution rate. The evaluations also showed that the film of the positive photoresist composition (4) had a low Tg, i.e., 118° C., indicating that it also has insufficient heat resistance.

The invention claimed is:
1. A positive photoresist composition containing, as an essential component, a novolac phenolic resin (C) prepared by a method comprising:
    a first step of polycondensing an alkyl-substituted phenol (a1) with an aromatic aldehyde (a2) by heating at 60° C. to 140° C. in the presence of an acid catalyst, optionally using a solvent, to prepare an aromatic compound (A) represented by general formula (1) or (2):

[Chem. 0]

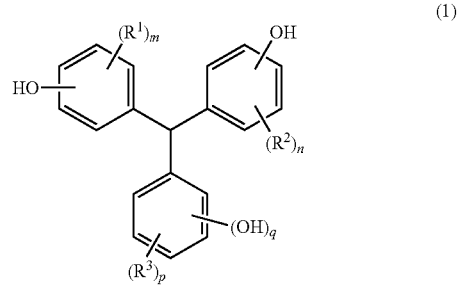

(1)

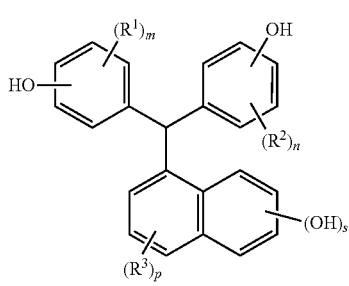

(2)

wherein $R^1$, $R^2$, and $R^3$ are each independently an alkyl group having 1 to 8 carbon atoms; m, n, and p are each independently an integer of 0 to 4; q is an integer of 1 to (5−p); and s is an integer of 1 to (9−p);

a second step of isolating the aromatic compound (A) prepared in the first step from the reaction solution; and a third step of polycondensing the aromatic compound (A) isolated in the second step with an aliphatic aldehyde (B) by heating at 60° C. to 140° C. in the presence of an acid catalyst, optionally using a solvent.

2. The positive photoresist composition according to claim 1, wherein the alkyl-substituted phenol (a1) is 2,5-xylenol and/or 2,6-xylenol.

3. The positive photoresist composition according to claim 1, wherein the aromatic aldehyde (a2) is hydroxybenzaldehyde and/or hydroxynaphthaldehyde.

4. The positive photoresist composition according to claim 1, wherein the aliphatic aldehyde compound (B) is formaldehyde.

5. The positive photoresist composition according to claim 2, wherein the aromatic aldehyde (a2) is hydroxybenzaldehyde and/or hydroxynaphthaldehyde.

6. The positive photoresist composition according to claim 2, wherein the aliphatic aldehyde compound (B) is formaldehyde.

7. The positive photoresist composition according to claim 3, wherein the aliphatic aldehyde compound (B) is formaldehyde.

8. The positive photoresist composition according to claim 5, wherein the aliphatic aldehyde compound (B) is formaldehyde.

* * * * *